(12) United States Patent
Kuo et al.

(10) Patent No.: US 11,403,993 B2
(45) Date of Patent: Aug. 2, 2022

(54) LIGHT-EMITTING DIODE DISPLAY DEVICE AND LIGHT-EMISSION CONTROL METHOD THEREOF

(71) Applicant: Au Optronics Corporation, Hsinchu (TW)

(72) Inventors: Yu-Chieh Kuo, Hsinchu (TW); Yu-Hsun Chiu, Hsinchu (TW); Kai-Hsiang Liu, Hsinchu (TW); Che-Chia Chang, Hsinchu (TW); Shang-Jie Wu, Hsinchu (TW); Mei-Yi Li, Hsinchu (TW); Peng-Bo Xi, Hsinchu (TW); Chin I Chiang, Hsinchu (TW); Yan-Ru Chen, Hsinchu (TW); Ting-Wei Guo, Hsinchu (TW); Chia-Ting Hsieh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/190,404

(22) Filed: Mar. 3, 2021

(65) Prior Publication Data
US 2022/0059014 A1  Feb. 24, 2022

(30) Foreign Application Priority Data

Aug. 24, 2020 (TW) ................................. 109128810
Dec. 23, 2020 (TW) ................................. 109145728

(51) Int. Cl.
*G09G 3/32* (2016.01)
*H01L 27/15* (2006.01)

(52) U.S. Cl.
CPC ............. *G09G 3/32* (2013.01); *H01L 27/156* (2013.01); *G09G 2310/0267* (2013.01); *G09G 2310/0275* (2013.01); *G09G 2310/08* (2013.01)

(58) Field of Classification Search
CPC ............. G09G 3/32; G09G 2310/0267; G09G 2310/0275; G09G 2310/08; H01L 27/156
See application file for complete search history.

(56) References Cited

U.S. PATENT DOCUMENTS

2005/0231450 A1* 10/2005 Takai ................... G09G 3/2014
345/77

* cited by examiner

*Primary Examiner* — Andrew Sasinowski
(74) *Attorney, Agent, or Firm* — JCIPRNET

(57) ABSTRACT

A light-emitting diode display device and a light-emission control method thereof are provided. The light-emitting diode display device includes a timing controller, multiple display pixels, and a scanning circuit. The display pixels form multiple display rows. The scanning circuit generates multiple scan signals and multiple light-emission signals that respectively drive the display rows. During a first data-writing time period of a first frame period, the timing controller provides multiple writing data to be respectively written into the display rows. During a light-emitting time period, the scanning circuit drives each of the light-emission signals to generate multiple pulses periodically according to a set period to drive the corresponding display rows. The light-emitting time period is after the first data-writing time period and before a second data-writing time period of a second frame period ends.

20 Claims, 15 Drawing Sheets

LIGHT-EMITTING DIODE DISPLAY DEVICE AND LIGHT-EMISSION CONTROL METHOD THEREOF

CROSS-REFERENCE TO RELATED APPLICATION

This application claims the priority benefits of Taiwan application serial no. 109128810, filed on Aug. 24, 2020, and Taiwan application serial no. 109145728, filed on Dec. 23, 2020. The entirety of each of the above-mentioned patent applications is hereby incorporated by reference herein and made a part of this specification.

BACKGROUND

Technical Field

The disclosure relates to a light-emitting diode display device and a light-emission control method thereof, and particularly to a light-emitting diode display device applicable to the variation of frame rate and a light-emission control method thereof.

Description of Related Art

In the conventional display device, when some applications (such as gaming programs) are executed, since the number of game frames that are output based on the display card is not in sync with the scanning rate of the display device, the user may see broken or torn images. To solve this issue, vertical synchronization is introduced to the conventional display device. However, after the function of vertical synchronization is turned on, since the display device still maintains a fixed rate of operation, the problem of delayed display images is still likely to occur. To fix this problem, some display card manufacturers have brought forth a variety of synchronization technologies to make the game images look smooth and seamless. Nevertheless, regardless of the synchronization technologies, the synchronization still relies on reducing the frame rate of the display device. And such method still has the issue(s) of uneven display brightness and/or image flicker when a pulse-driven light-emitting diode display device varies its refresh rate.

SUMMARY

The disclosure provides a light-emitting diode display device and a light-emission control method thereof, which are adapted to maintain the display quality when the frame rate is dynamically varied.

The disclosure also provides a light-emitting diode display device capable of reducing image flicker while maintaining luminous efficacy.

The light-emitting diode display device of the present disclosure includes a timing controller, multiple display pixels, and a scanning circuit. Multiple display rows are formed. The scanning circuit generates multiple scan signals and multiple light-emission signals that respectively drive the display rows. During a first data-writing time period of a first frame period, the timing controller provides multiple write-in data to be respectively written into the display rows. During a light-emitting time period, the scanning circuit drives each light-emission signal to generate multiple pulses periodically based on a set period to drive the corresponding display row to emit light according to each corresponding write-in data. The light-emitting time period is provided after the first data-writing time period and before the end of a second data-writing time period of a second frame period.

The light-emission control method of the present disclosure is adapted for a light-emitting diode display device. The light-emission control method includes: generating multiple scan signals and multiple light-emission signals to respectively drive multiple display rows formed by multiple display pixels; providing multiple write-in data into the display rows during a first data-writing time period of a first frame period to be written into the display rows; and, during a light-emitting time period which is after the first data-writing time period and before the end of a second data-writing time period of a second frame period, driving each light-emission signal to generate multiple pulses periodically based on a set period to drive each of the corresponding display row to emit light according to each corresponding write-in data.

Another light-emitting diode display device of the present disclosure includes multiple display pixels and a driving circuit. The Nth display pixel performs data-writing operation according to the corresponding first gate drive signal, and lights up the corresponding light-emitting diode according to the Nth ramp control signal and the Nth light-emission signal. The first gate drive signal has a first operating rate, and the Nth ramp control signal and the Nth light-emission signal have a second operating rate, where the first operating rate is lower than the second operating rate, and N is a positive integer.

Based on the above, the present disclosure configures each light-emission signal to generate periodically multiple pulses based on a set period during a light-emitting time period amid two adjacent frame periods, thereby driving each corresponding display row to emit light according to the corresponding write-in data. This way, when the frame rate is varied dynamically, the display image does not flicker nor be torn due to the varied frame rate, and improves the display quality effectively. In addition, in the embodiments of the disclosure, the operating rate of the ramp control signal and the light-emission signal is higher than the operating rate of the first gate drive signal on which the data writing operation is based, so as to reduce the occurrence of flicker of the displayed images.

DESCRIPTION OF THE EMBODIMENTS

Figure 1:
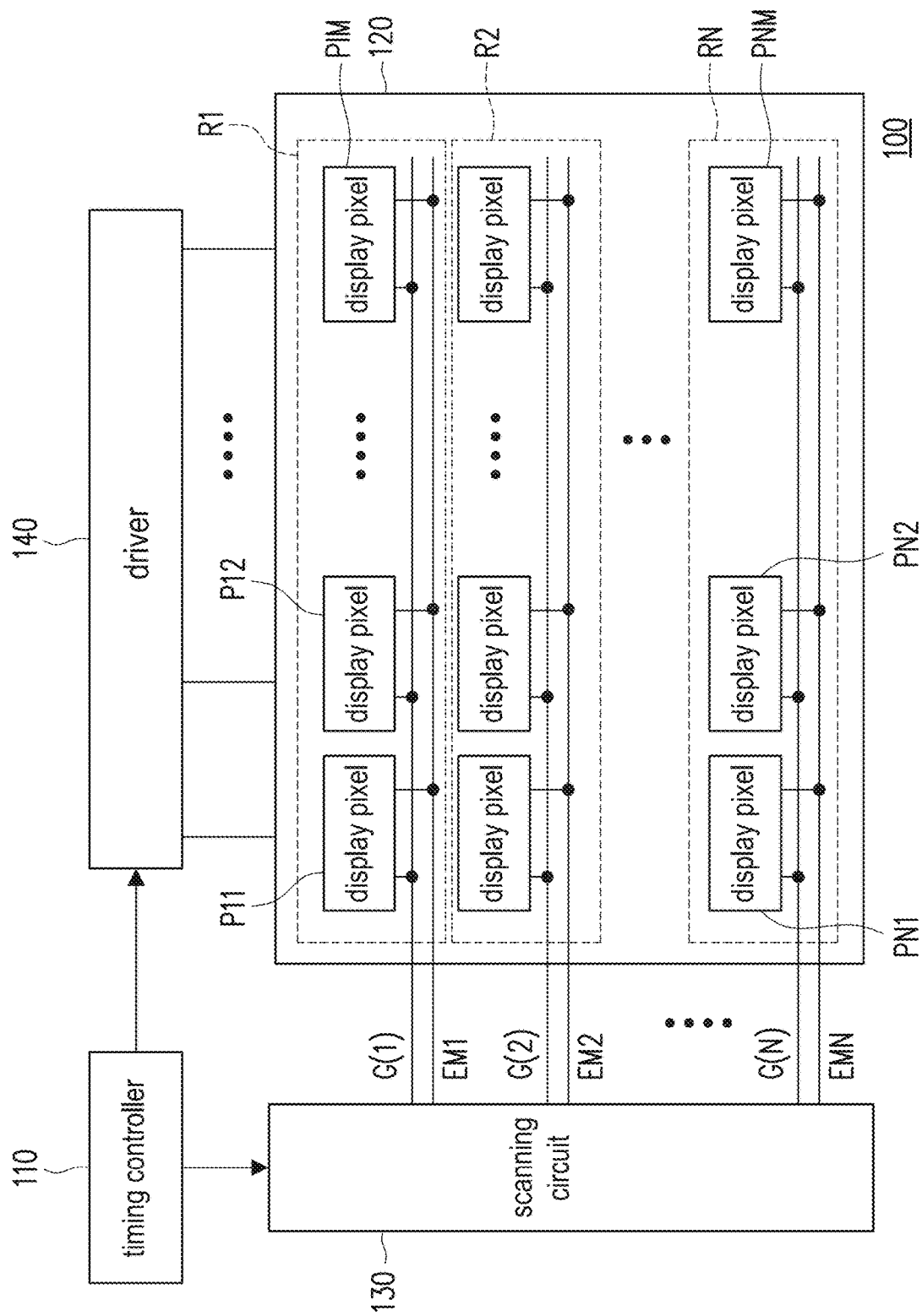
FIG. 1 is a schematic view of a light-emitting diode display device according to an embodiment of the present disclosure.

FIG. 1 is a schematic view of a light-emitting diode display device according to an embodiment of the present disclosure. A display device 100 includes a timing controller 110, a pixel array 120, a scanning circuit 130, and a driver 140. The pixel array 120 is composed of a plurality of display pixels P11 to PNM. The display pixels P11 to PNM form a plurality of display rows R1 to RN. The scanning circuit 130 is coupled to the timing controller 110 and the display rows R1 to RN. The scanning circuit 130 may generate a plurality of scan signals G(1) to G(N) and a plurality of light-emission signals EM1 to EMN according to a timing control command TCMD sent by the timing controller 110. The scan signals G(1) to G(N) and the light-emission signals EM1 to EMN are respectively provided to the display rows R1 to RN, and are respectively adapted to drive the display pixels P11 to PNM in the display rows R1 to RN.

The timing controller 110 is further coupled to the driver 140. The timing controller 110 may adopt the driver 140 to write the write-in data into the display pixels P11 to PNM in corporation with the enabling sequence of the scan signals G(1) to G(N). In one frame period, the timing controller 110 may perform the writing operation of the write-in data of the corresponding display pixel during the data-writing time period.

Figure 2:
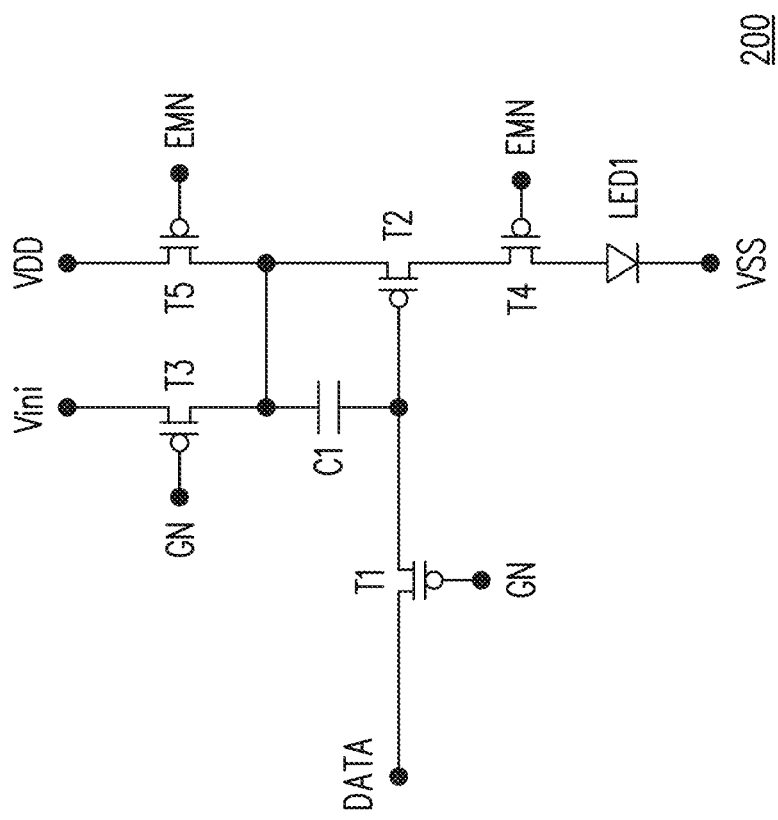
FIG. 2 is a schematic view of an implementation of a display pixel according to an embodiment of the present disclosure.

In the present embodiment, the display pixels P11 to PNM are all light-emitting diode display pixels. For the hardware structure of each pixel, please refer to FIG. 2, the schematic view of the implementation of the display pixel in the embodiment of the present disclosure. In FIG. 2, a display pixel 200 includes transistors T1 to T5, a light-emitting diode LED1, and a capacitor C1. The transistor T2 is a driving transistor adapted to provide a driving current to drive the light-emitting diode LED1 to emit light. A first terminal of the transistor T5 receives a power supply voltage VDD; a second terminal of the transistor T5 is coupled to a first terminal of the transistor T2; and a control terminal of the transistor T5 receives a light-emission signal EMN. A second terminal of the transistor T4 receives a reference ground voltage VSS; a second terminal of the transistor T4 is coupled to a second terminal of the transistor T2; and a control terminal of the transistor T4 also receives the light-emission signal EMN. Also, a terminal of the transistor T1 receives write-in data DATA; the other terminal of the transistor T1 is coupled to a control terminal of the transistor T2, and the transistor T1 is controlled by a scan signal GN. A terminal of the transistor T3 receives an initial voltage Vini; the other terminal of the transistor T3 is coupled to the first terminal of the transistor T2; and the transistor T3 is also controlled by the scan signal GN. The capacitor C1 is coupled between the first terminal and the control terminal of the transistor T2.

In this embodiment, during the data-writing time period, the transistors T1 and T3 are turned on (the transistors T4 and T5 are turned off), and the write-in data DATA is written into the capacitor C1. During the light-emitting time period, the transistors T5 and T4 are turned on (the transistors T1 and T3 are turned off), and the transistor T2 receives the power supply voltage VDD, and a driving current is generated according to the write-in data DATA stored in the capacitor C1, and the light-emitting diode LED1 is driven to emit light through the driving current.

The display pixel 200 may be applied to implement each of the display pixels P11 to PNM in FIG. 1. In addition, each of the display pixels P11 to PNM in FIG. 1 is not limited to the implementation of the display pixel 200. All light-emitting diode display pixels well-known to those with common knowledge in the art can be applied to the present disclosure without particular restrictions.

Please refer to FIG. 1 again. In FIG. 1, the scanning circuit 130 may be constructed by using a gate driver known to those skilled in the art, and the driver 140 may be constructed by using a source driver known to those skilled in the art. The timing controller 110 may be constructed by using a digital circuit. It is worth mentioning that the display device 100 of the embodiment of the present disclosure may be implemented in an application of variable refresh rate, where the time lengths of two frame periods adjacent in time may be the same with or different from each other.

Figure 3:
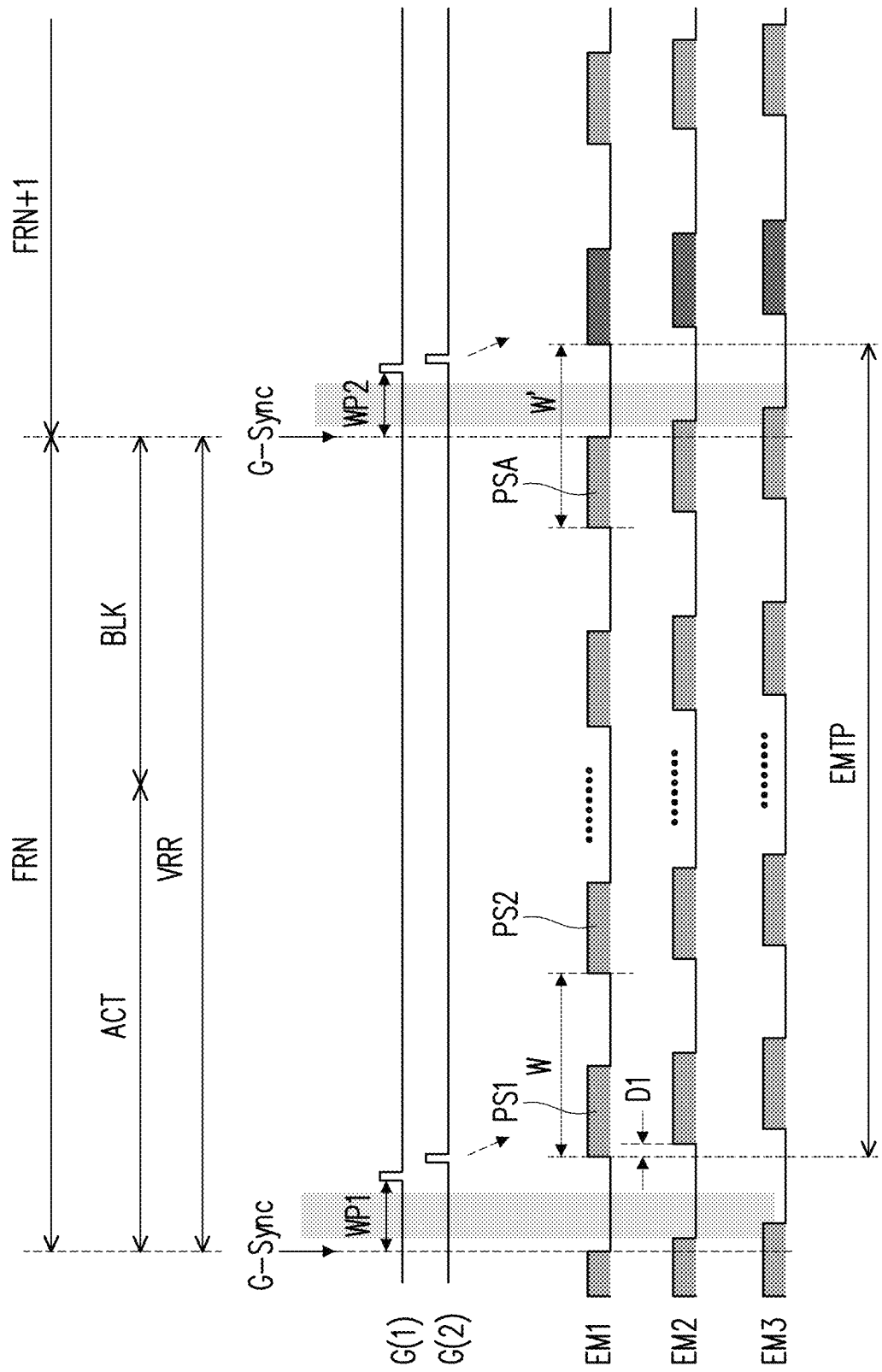
FIG. 3 to FIG. 7 show waveform diagrams of multiple implementations of a light-emitting diode display device according to the embodiments of the present disclosure.

Please refer to FIG. 1 and FIG. 3 at the same time. FIG. 3 shows waveform diagrams of a light-emitting diode display device according to an embodiment of the present disclosure. The display device 100 starts each frame period with a synchronization signal G-Sync. Take a first frame period FRN as an example. The first frame period FRN may be divided into an active period ACT and a blank period BLK. In this embodiment, corresponding to a display row R1, the scanning circuit 130 provides the scan signal G(1) and the light-emission signal EM1 to drive the display row R1. During the first frame period FRN, the period between the positive pulse of the synchronization signal G-Sync and the enabling pulse of the scan signal G(1) is a first writing time period WP1 of the write-in data of the display row R1. During the first writing time period WP1, the timing controller 110 may provide the write-in data through the driver 140 to be written into a plurality of display pixels P11 to P1M of the display row R1. The scanning circuit 130 makes the scan signal G(1) generate the first enabling pulse after the first writing time period WP1.

During a second frame period FRN+1 that ensues, the period between the positive pulse of the synchronization signal G-Sync and the positive pulse of the scan signal G(1) may be a second writing time period WP2 of the write-in data of the display row R1. During the second writing time period WP2, the timing controller 110 may execute the writing operation of the next write-in data of the display pixels P11 to P1M of the display row R1 through the driver 140.

Note that the display device 100 of the embodiment of the present disclosure may define a light-emitting time period based on the timing after the first writing time period WP1 in the first frame period FRN and the timing when the second writing time period WP2 in the second frame period FRN+1 ends. During the light-emitting time period EMTP, the scanning circuit 130 may make the light-emission signal EM1 corresponding to the display row R1 generate a plurality of pulses PS1 to PSA based on a predetermined set period W. Among the above, in this embodiment, the time length of the light-emitting time period EMTP may be an integral multiple of the set period W.

Note here that in the embodiment of the present disclosure, corresponding to each frame period, the light-emission signals EM1 to EM3 each have the same amount of pulses. And, corresponding to each frame period, the set period W does not change.

Incidentally, corresponding to each frame period, the scan signals G(1) to G(N) generated by the scanning circuit 130 sequentially have a time delay. Correspondingly, the light-emission signals EM1 to EMN generated by the scanning circuit 130 also sequentially have the same time delay Dl. In addition, the duty cycle of each of the light-emission signals EM1 to EMN may be 50-50, or be defined to be other values by the designer according to his needs.

Note here that in this embodiment, the pulses PS1 to PSA of the light-emission signal EM1 are evenly distributed in the active period ACT and the blank period BLK of the first frame period FRN. As the first frame period FRN of the embodiment of the present disclosure has a variable period VRR that can be dynamically varied, the display pixels P11 to PNM may be continuously lit, thus maintaining the display performance effectively.

Figure 4:
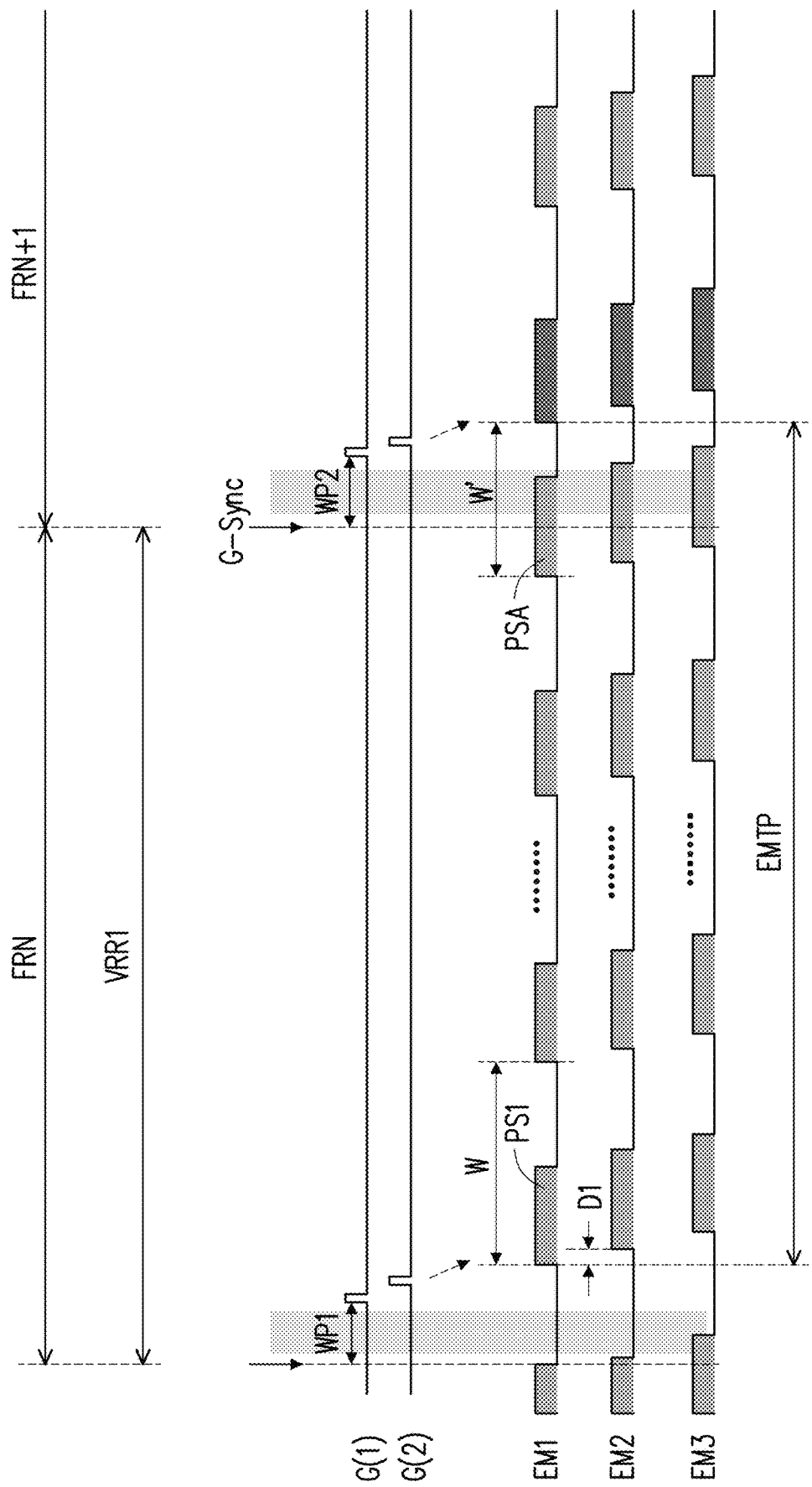

Please refer to FIG. 1 and FIG. 4 at the same time. FIG. 4 shows waveform diagrams of a light-emitting diode display device according to another embodiment of the present disclosure. Unlike the embodiment in FIG. 3, in FIG. 4, a variable period VRR1 of the first frame period FRN is different from the variable period in FIG. 3. Among them, the time length of the variable period VRR1 is shorter than the time length of the variable period VRR. Therefore, in the embodiment of FIG. 4, corresponding to the first frame period FRN, the time length of the light-emitting time period EMTP is not equal to an integer multiple of the set period W on which the scanning circuit 130 generates the light-emission signal EM1 is based. Therefore, the scanning circuit 130 may make the period of the first pulse PS1 of the light-emission signal EM1 (which is equal to the set period W) different from a period W' of the last pulse PSA. Among them, the period W' is less than the set period W.

Figure 5:
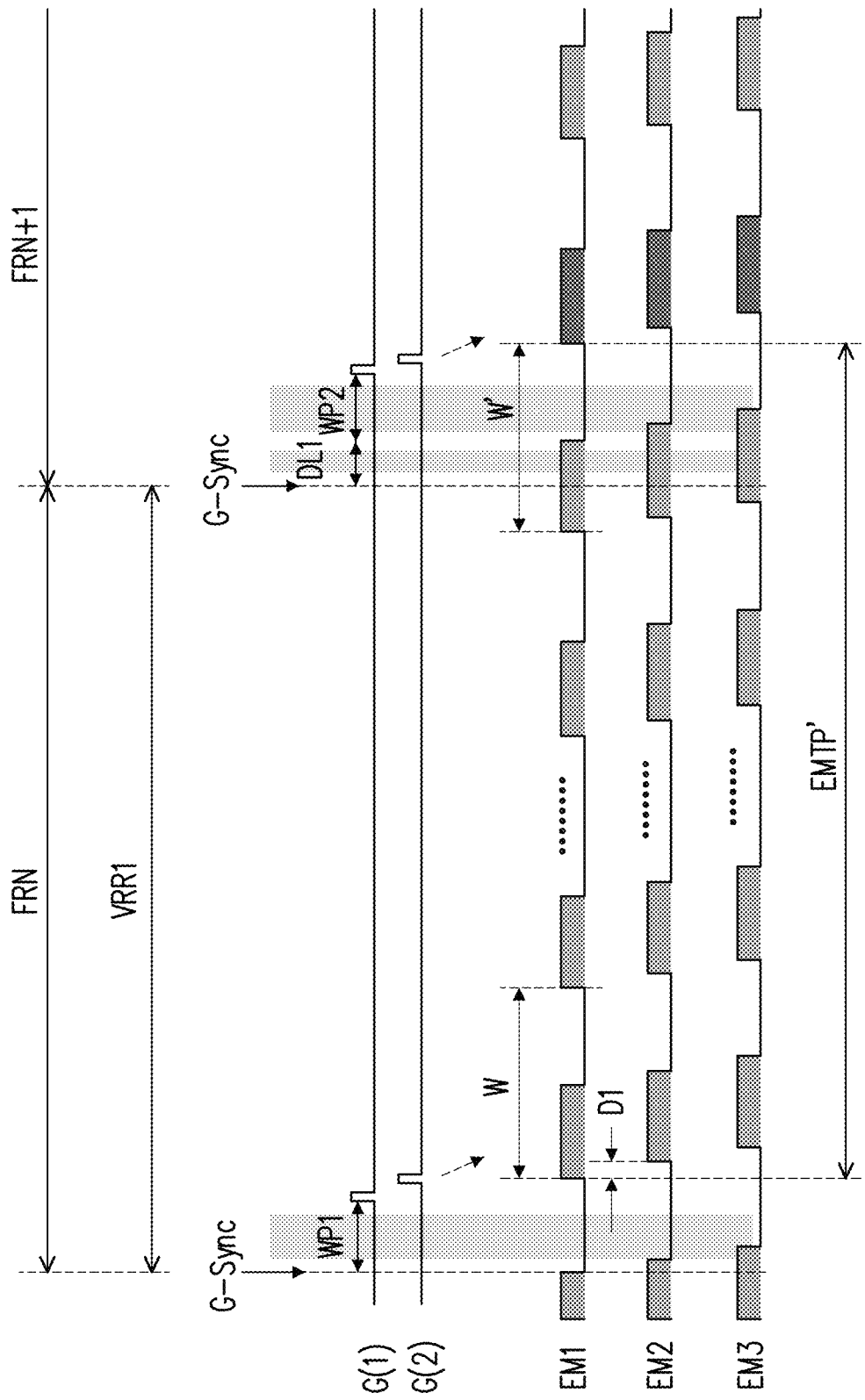

Please refer to FIG. 1 and FIG. 5 at the same time. FIG. 5 shows waveform diagrams of a light-emitting diode display device according to another embodiment of the present disclosure. Following the implementation of FIG. 4, corresponding to the first frame period FRN, when the time length of the light-emitting time period is not equal to an integer multiple of the set period W on which the scanning circuit 130 generates the light-emission signal EM1 is based, the timing controller 110 in the embodiment of the present disclosure may set a delay time period DL1 before the second data-writing time period WP2 of the second frame period FRN+1, and generate the time length of an increased light-emitting time period EMTP'.

In this embodiment, the increased time length of the light-emitting time period EMTP' may be equal to an integer multiple of the set period W.

Figure 6:
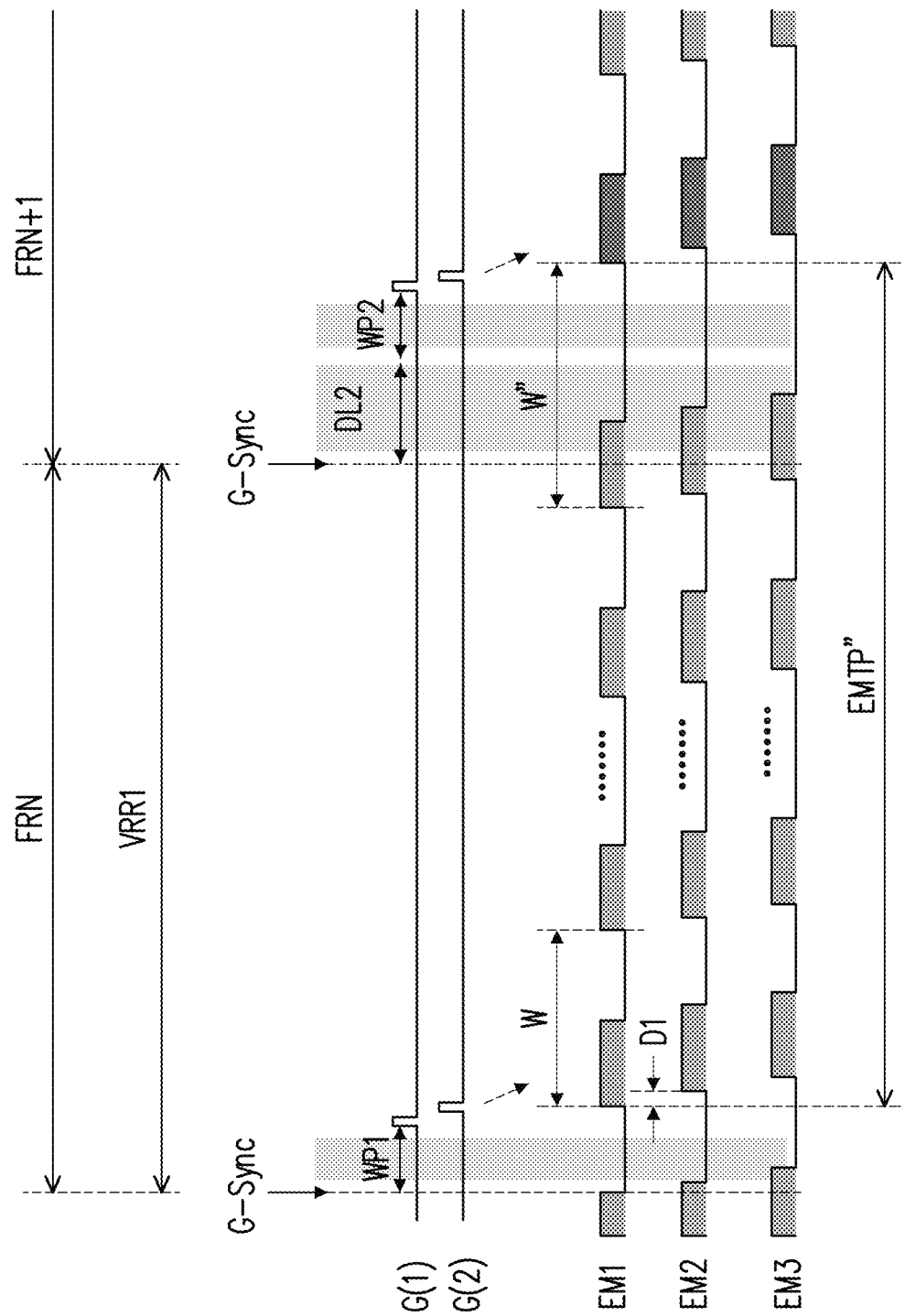

Please refer to FIG. 1 and FIG. 6 at the same time. FIG. 6 shows waveform diagrams of a light-emitting diode display device according to another embodiment of the present disclosure. Following the embodiment of FIG. 5, in FIG. 6, the timing controller 110 may set another delay time period DL2 before the second data-writing time period WP2 of the second frame period FRN+1, in which the time length of the delay time period DL2 is longer than the time length of the delay time period DL1. In addition, under such conditions, corresponding to the delay time period DL2, the time length of the light-emitting time period EMTP" generated in this embodiment is not necessarily equal to an integer multiple of the set period W.

Figure 7:
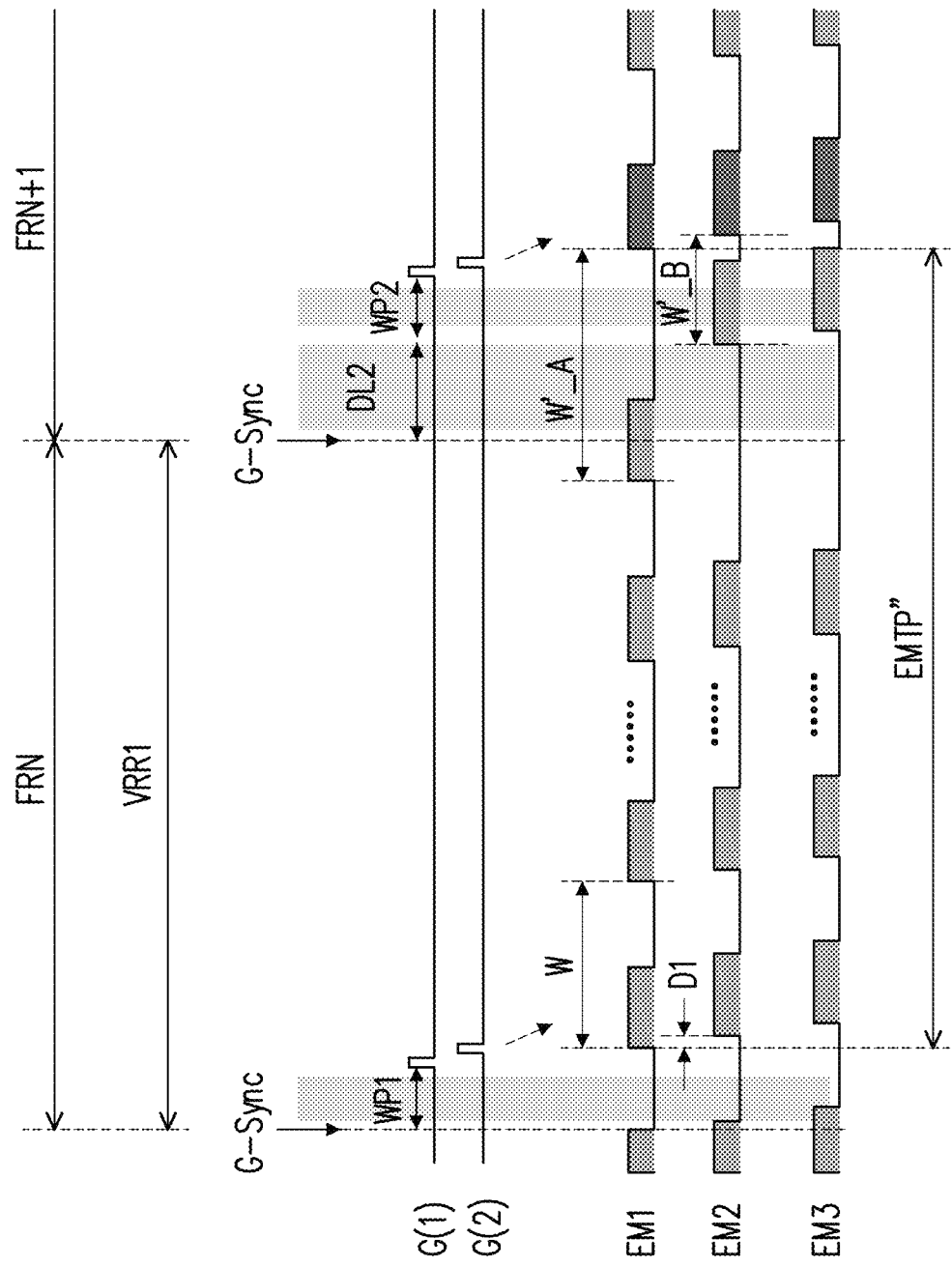

Please refer to FIG. 1 and FIG. 7 at the same time. FIG. 7 shows waveform diagrams of a light-emitting diode display device according to another embodiment of the present disclosure. In this embodiment, following the embodiment of FIG. 6, when the time length of the light-emitting time period EMTP'" is not equal to an integer multiple of the set period W, the scanning circuit 130 may distinguish the generated light-emission signals EM1 to EMN to be at least one first light-emission signal and at least one second light-emission signal. In this embodiment, the light-emission signal EM1 may be classified as the first light-emission signal, and the light-emission signals EM2 and EM3 may be classified as the second light-emission signal.

Note here that the light-emission signal EM1 classified as the first light-emission signal corresponds to the first frame period FRN, and that the last pulse PS1A is disposed between the delay time period DL2 and does not overlap with the second data-writing time period WP2 of the second frame period FRN+1. The light-emission signals EM2 and EM3, which are classified as the second light-emission signal, correspond to the first frame period FRN, and their last pulses PS2A and PS3A may be provided outside the delay time period DL2 and overlap at least partially with the second data-writing time period WP2 of the second frame period FRN1. In this embodiment, corresponding to the first frame period FRN, a period W'_A of the last pulse PS1A of the light-emission signal EM1 may be greater than a period W'_B of the last pulse PS2A of the light-emission signal EM2.

Incidentally, in this embodiment, in the operation of classifying the light-emission signals EM1 to EMN, the number of the first light-emission signals may be made equal to the number of the second light-emission signals. Alternatively, the number of the first light-emission signals may also not be equal to the number of the second light-emission signals, which is not particularly limited.

Figure 8:
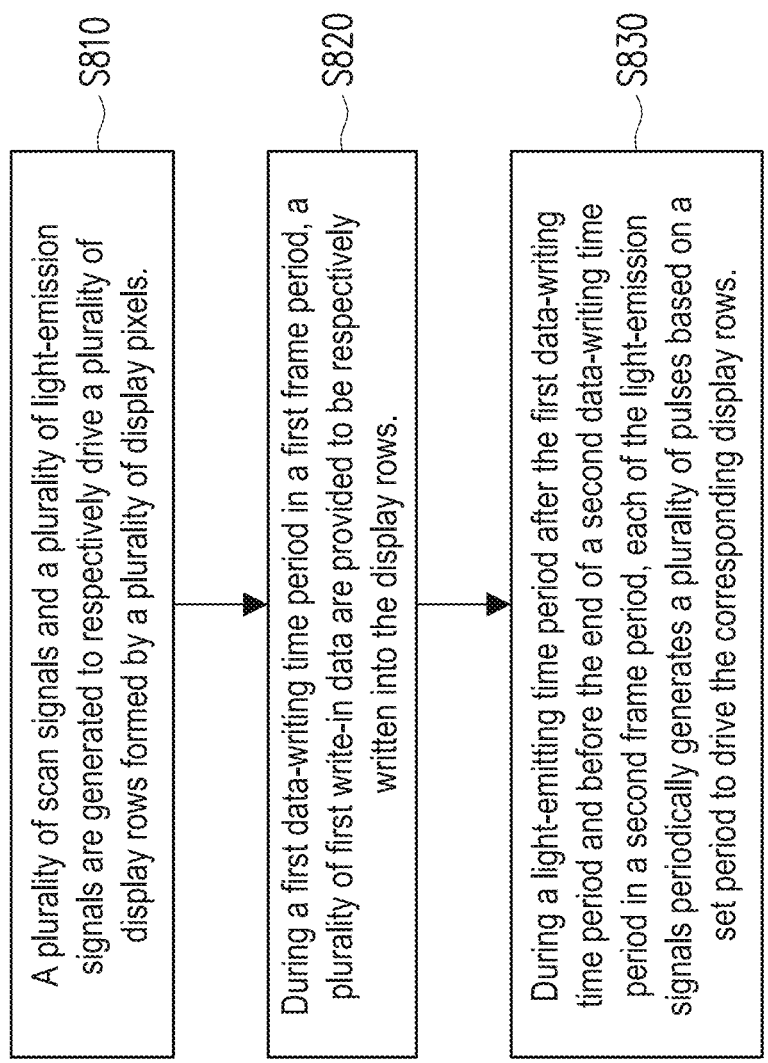
FIG. 8 is a flowchart of a light-emission control method according to an embodiment of the present disclosure.

FIG. 8 is a flowchart of a light-emission control method according to an embodiment of the present disclosure. The light-emission control method of the present embodiment is adapted for the light-emitting diode display device. In step S810, a plurality of scan signals and a plurality of light-emission signals are generated to respectively drive a plurality of display rows formed by a plurality of display pixels. In step S820, during the first data-writing time period in the first frame period, a plurality of first write-in data are provided to be respectively written into the display rows. And, during the light-emitting time period that is after the first data-writing time period and before the end of the second data-writing time period in the second frame period, based on a set period, each of the light-emission signals periodically generates a plurality of pulses to drive the corresponding display rows.

Relevant details of the above steps have been described in the aforementioned embodiments and implementations, which are not be repeated hereinafter.

Figure 9:
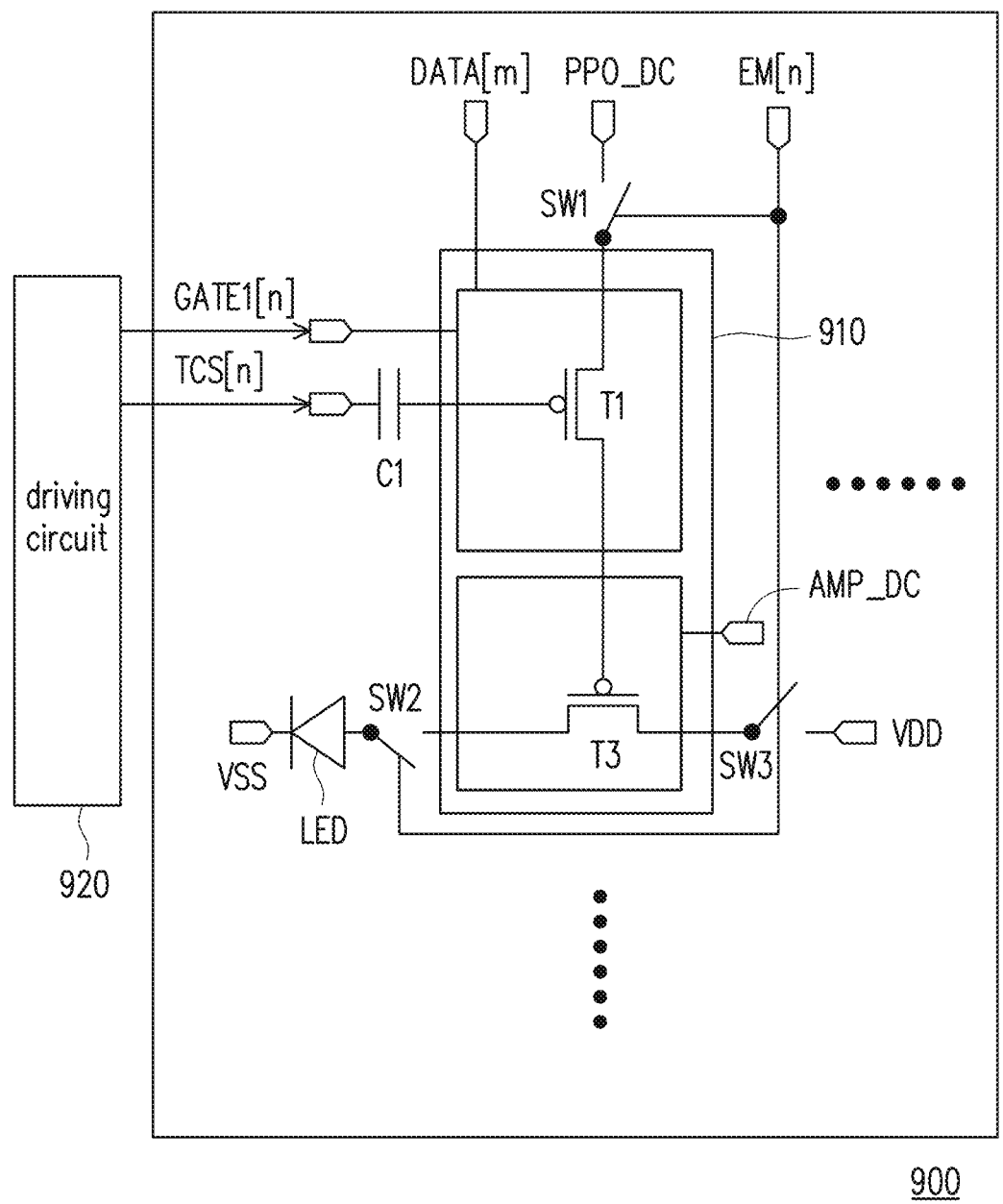
FIG. 9 is a schematic view of a light-emitting diode display device according to another embodiment of the present disclosure.

Please refer to FIG. 9 for the description below. FIG. 9 is a schematic view of a light-emitting diode display device according to another embodiment of the present disclosure. A light-emitting diode display device 900 includes a plurality of display pixels 910 and a driving circuit 920. In this embodiment, the Nth pixel circuit 910 in the figure receives write-in data DATA[m] and executes the writing operation according to the corresponding first gate drive signal GATE1[n]. The pixel circuit 910 lights up the corresponding light-emitting diode LED according to the Nth ramp control signal TCS[n] and the Nth light-emission signal EM[n]. In this embodiment, the first gate drive signal GATE1[n] has a first operating rate, and the Nth ramp control signal TCS[n] and the Nth light-emission signal EM[n] have a second operating rate, where the first operating rate is lower than the second operating rate, and the N mentioned may be any positive integer.

Specifically, the pixel circuit 910 may receive the write-in data DATA[m] according to the first gate drive signal GATE1[n] that has a relatively low operating rate (the first operating rate), and write the write-in data DATA[m] into a driving transistor T1. Then, the transistor T1 in the pixel circuit 910 is turned on gradually according to the Nth ramp control signal TCS[n] that has a relatively high operating rate (the second operating rate), and provides a reference voltage PPO_DC to the control terminal of a driving transistor T3 through a switch SW1. Meanwhile, switches SW1 to SW3 in the pixel circuit 910 are turned on according to the Nth light-emission signal EM[n] having a relatively high operating rate. This way, the driving transistor T3 receives a power supply voltage VDD and be coupled to a light-emitting diode LED. The driving transistor T3 may then provide a driving current to light up the light-emitting diode LED. In this embodiment, the anode of the light-emitting diode LED is coupled to the driving transistor T3 through the switch SW2 to receive the driving current, and the cathode of the light-emitting diode LED is coupled to the reference ground voltage VSS. In this embodiment, a reference voltage PPO_DC may be a pulse-width modulation pinch off voltage.

Note that based on the fact that the second operating rate is higher than the first operating rate, the pixel circuit 910 can perform multiple light-emitting operations continuously after one writing operation of the write-in data. As a result, the image flicker may be reduced while maintaining the luminous efficacy of the light-emitting diode LED, especially in the case of a display of low-brightness.

Incidentally, the driving circuit 920 in this embodiment can be a gate driving circuit in any form, such as a gate on array (GOA).

Figure 10:
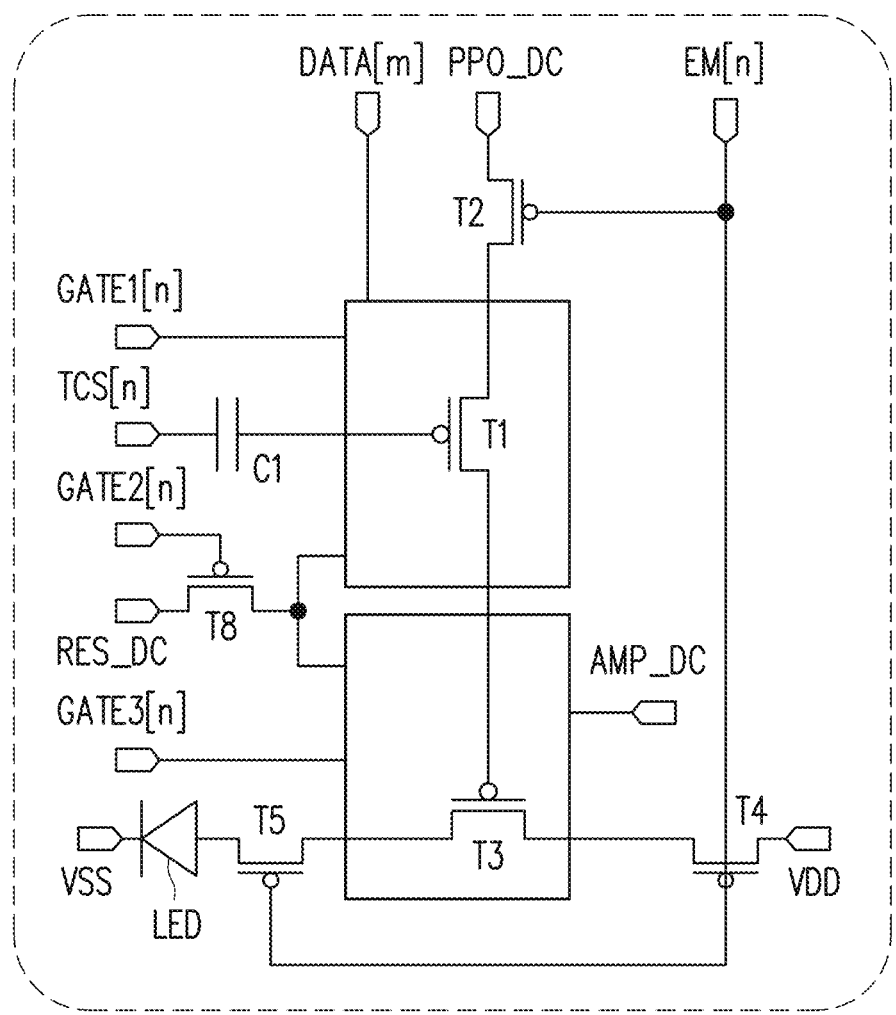
FIG. 10 is a schematic view of another implementation of the pixel circuit of the light-emitting diode display device according to the embodiment of the present disclosure.

Please refer to FIG. 10 for the description below. FIG. 10 is a schematic view of another implementation of the pixel circuit of the light-emitting diode display device according to the embodiment of the present disclosure. A pixel circuit 1000 may be the Nth pixel circuit in a light-emitting diode display device. The pixel circuit 1000 includes transistors T1 to T8 and a capacitor C1. The first terminal of the capacitor C1 receives the Nth ramp control signal TCS[n], and the second terminal of the capacitor C1 is coupled to the control terminal of the transistor T1. The first terminal of the transistor T2 receives a reference voltage PPO_DC. The second terminal of the transistor T2 is coupled to the first terminal of the transistor T1. And the control terminal of the transistor T2 receives the Nth light-emission signal EM[n]. In addition, the second terminal of the transistor T1 is coupled to the control terminal of the transistor T3.

Furthermore, the transistors T4, T3, and T5 are coupled sequentially in series between a power supply voltage VDD and a reference ground voltage VSS. The control terminals of the transistors T4 and T5 both receive the Nth light-emission signal EM[n]. Compared with the embodiment in FIG. 9, the transistors T2, T4, and T5 here are respectively adapted to implement the switches SW1, SW3, and SW2 in FIG. 9.

Yet different from FIG. 9, the pixel circuit 1000 in this embodiment also receives a reset voltage RES_DC through the transistor T8. The transistor T8 is controlled by a second gate drive signal GATE2[n]. When the transistor T8 is turned on according to the second gate drive signal GATE2[n], the pixel circuit 1000 performs a reset operation according to the reset voltage RES_DC. In addition, the pixel circuit 1000 further receives a reference voltage AMP_DC and a third gate drive signal GATE3 [n]. The pixel circuit 1000 may receive the reference voltage AMP_DC according to the third gate drive signal GATE3 [n], and the reference voltage AMP_DC is adapted to adjust the current amplitude for driving the light-emitting diode. In this embodiment, the reference voltage AMP_DC is equal to the write-in data DATA[m].

It is worth mentioning that the second gate drive signal GATE2[n] has components of the first operating rate and also of the second operating rate. In other words, the second gate drive signal GATE2[n] may be a switch signal of a mixed rate. In addition, the third gate drive signal GATE3[n] has the same second operating rate as the Nth light-emission signal EM[n ] and the Nth ramp control signal TCS[n].

Figure 11:
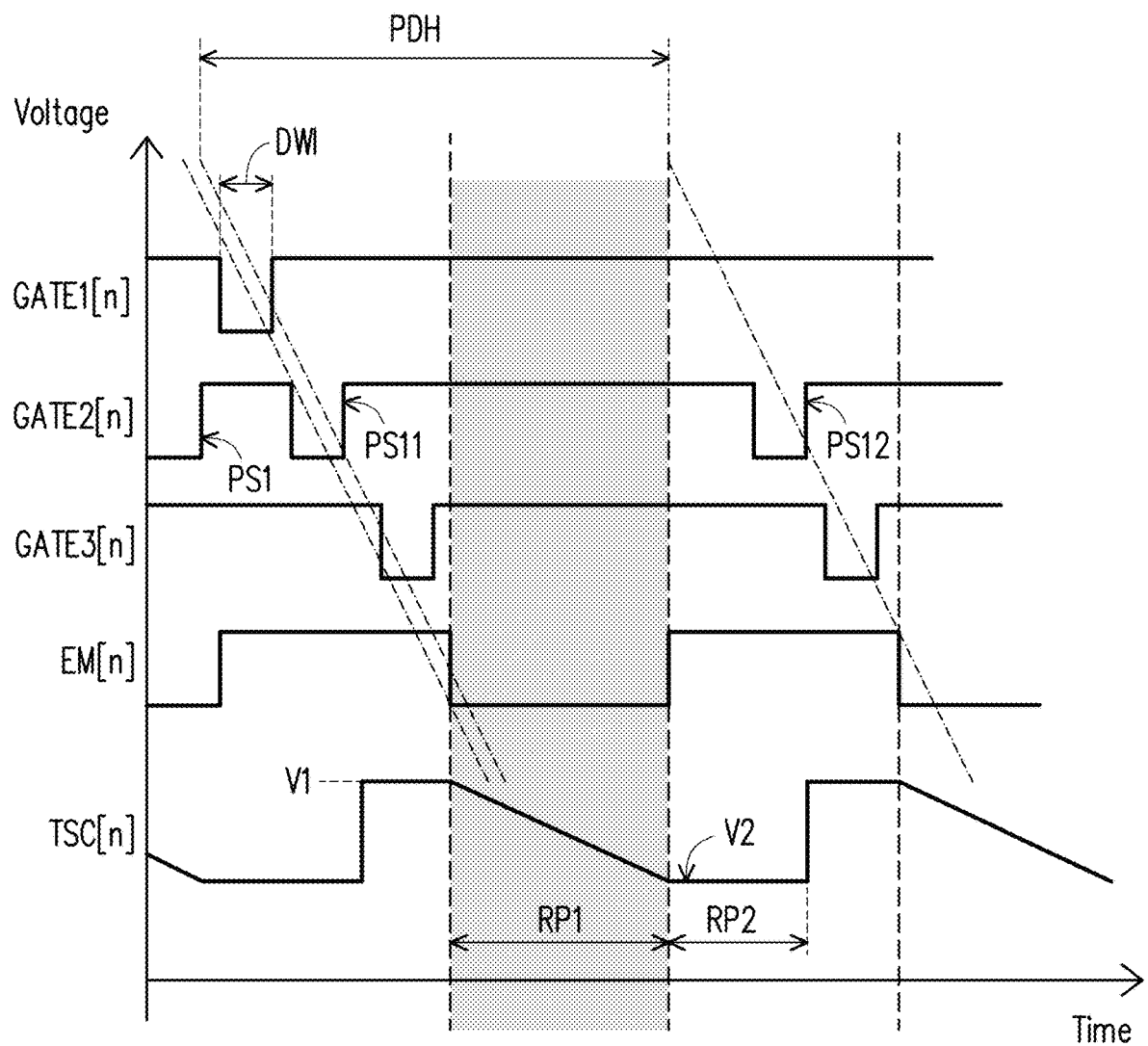
FIG. 11 is a waveform diagram of a pixel circuit in operation according to an embodiment of the present disclosure.

Please refer to FIG. 10 and FIG. 11 at the same time. FIG. 11 is a waveform diagram of a pixel circuit in operation according to an embodiment of the present disclosure. The first gate drive signal GATE1[n] is enabled (being pulled down to a voltage value) during a period DWI when the writing operation is performed, which allows the pixel circuit 1000 to perform the writing operation of the write-in data DATA[m]. After the period DWI, the third gate drive signal GATE3[n], the Nth light-emission signal EM[n], and the Nth ramp control signal TCS[n] are enabled periodically according to a period PDH, and the period PDH corresponds to the second operating rate. Between the two adjacent low pulses of the third gate drive signal GATE3[n], corresponding to the Nth light-emission signal EM[n] that is pulled down, the Nth ramp control signal TCS[n] falls from a first voltage V1 to a second voltage V2 according to a set slope during a time period RP1. The Nth ramp control signal TCS[n] may maintain equal to the second voltage V2 during the time period RP2 corresponding to the pulled-up Nth light-emission signal EM[n].

It is worth mentioning that the second gate drive signal GATE2[n] is pulled down before the period DWI to generate a low pulse PS1. After the period DWI, the second gate drive signal GATE2[n] generates a plurality of low pulses PS11 to PS12 according to the second operating rate. Among them, the low pulse PS1 of the second gate drive signal GATE2[n] has the first operating rate.

In this embodiment, the second operating rate is an integer multiple of the first operating rate. That is to say, during the period DWI of the data writing operation and the period of the next data writing operation, the Nth ramp control signal TCS[n] and the Nth light-emission signal EM[n] may have multiple complete periods.

Figure 12:
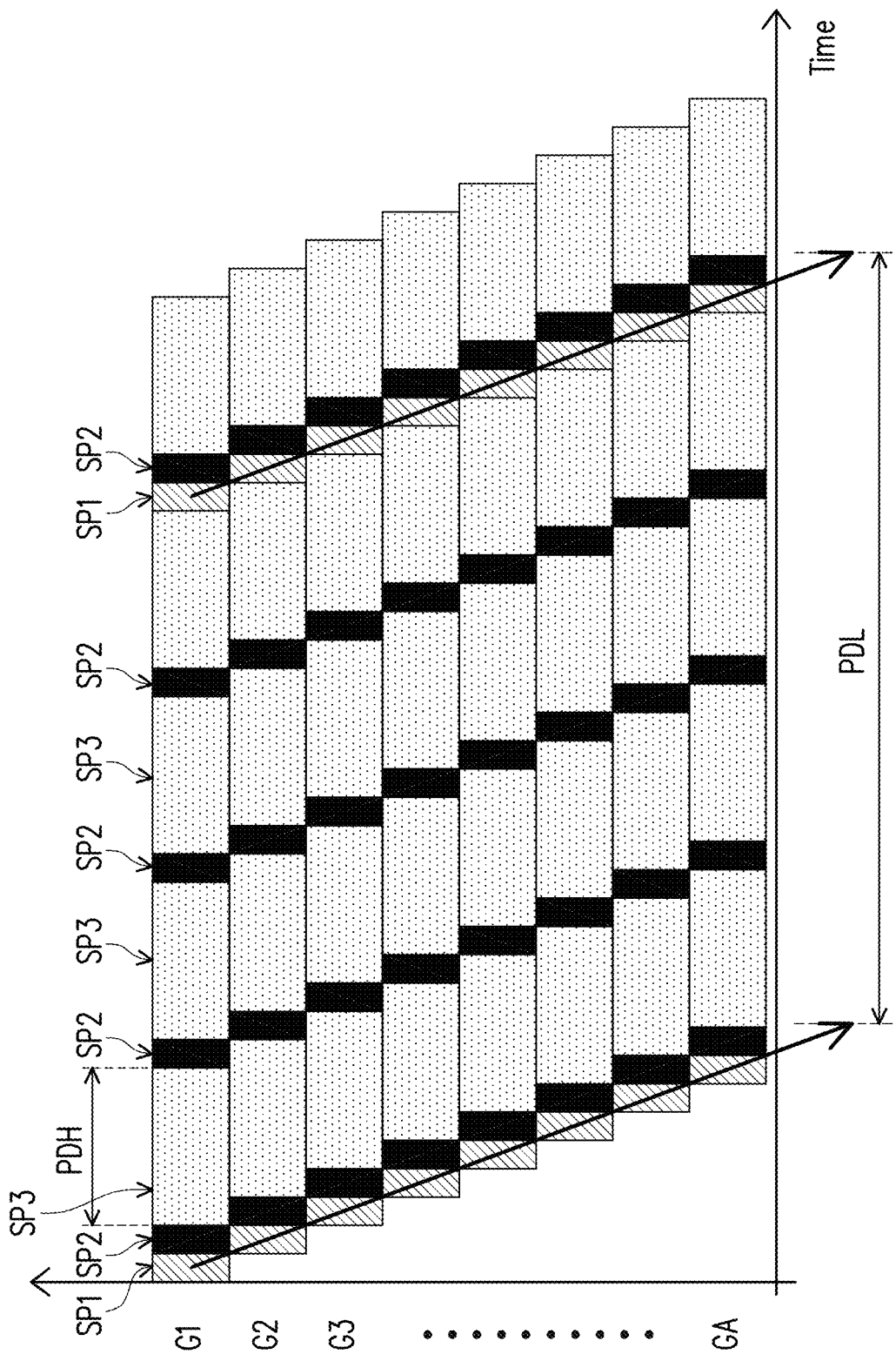
FIG. 12 is a schematic view of a driving timing of the light-emitting diode display device according to an embodiment of the present disclosure.

Please refer to FIG. 12 for the description below. FIG. 12 is a schematic view of a driving timing of the light-emitting diode display device according to an embodiment of the present disclosure. In a light-emitting diode display device having a plurality of display rows G1 to GA, the corresponding pixel circuits are driven in sequence. Take the display row G1 as an example. The pixel circuits on the display row G1 execute data writing operation during the time period SP1, enabling the third gate signal and the light-emission signal during the time periods SP2 and SP3 sequentially, and perform the reset operation and the light-emitting operation respectively. Among the above, the time period SP1 has a relatively long period PDL. The period PDL corresponds to a first operating rate with a relatively low rate. The time periods SP2 and SP3 have a relatively short period PDH. The periodic PDH corresponds to a second operating rate with a relatively high rate.

Note that when the pixel circuit needs to drive the light-emitting diode to emit light with higher brightness, during the time period SP3, the length of time in which the light-emission signal is enabled may be adjusted to be longer. In contrast, when the pixel circuit needs to drive the light-emitting diode to emit light with a lower brightness, during the time period SP3, the length of time in which the light-emission signal is enabled may be shortened. In other words, through the pulse-width modulation, the light-emitting diode has a stable driving current value, whether it is to emit light of a low or high brightness. Moreover, under any condition above, the operating rate of the light-emission signal does not need to change. Therefore, the embodiments of the disclosure improve the display quality through the light-emission driving mechanism of low flicker and multiple pulse-width modulation.

Figure 13:
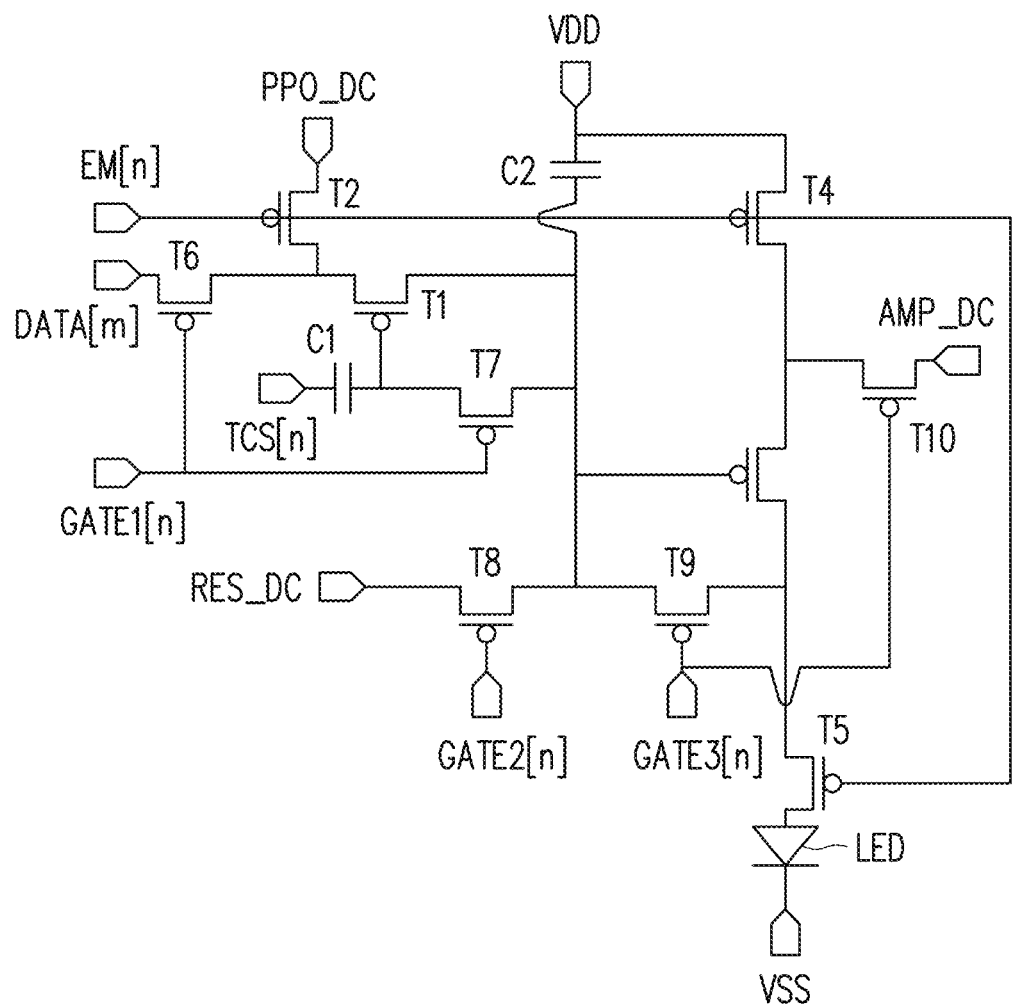
FIG. 13 is a schematic view of another implementation of the pixel circuit of the light-emitting diode display device according to the embodiment of the present disclosure.

Please refer to FIG. 13 for the description below. FIG. 13 is a schematic view of another implementation of the pixel circuit of the light-emitting diode display device according to the embodiment of the present disclosure. A pixel circuit 1300 includes transistors T1 to T10 and capacitors C1 and C2. In this embodiment, the capacitor C1 has a first terminal to receive the Nth ramp control signal TCS[n]. The transistor T1 has a control terminal to be coupled to the second terminal of the capacitor C1. The transistor T2 has a first terminal to receive a reference voltage PPO_DC; the second terminal of the transistor T2 is coupled to the first terminal of the transistor T1; and the control terminal of the transistor T2 receives the Nth light-emission signal EM[n]. The transistor T3 has a control terminal coupled to the second terminal of the transistor T1. The transistor T4 has a first terminal to receive a power supply voltage VDD; the second terminal of the transistor T4 is coupled to the first terminal of the transistor T3; and the control terminal of the transistor T4 receives the Nth light-emission signal EM[n]. The transistor T5 has a first terminal coupled to a second terminal of the transistor T3; the second terminal of the transistor T5 is coupled to a light-emitting diode LED; and the control terminal of the transistor T5 receives the Nth light-emission signal EM[n].

Furthermore, the transistor T6 has a first terminal to receive write-in data DATA[m]; the second terminal of the transistor T6 is coupled to the first terminal of the transistor T1; and the control terminal of the transistor T6 receives a first gate drive signal GATE1[n]. The transistor T7 has a first terminal coupled to the second terminal of the capacitor C1; the control terminal of the transistor T7 receives the gate drive signal GATE1[n]; and the second terminal of the transistor T7 is coupled to the control terminal of the transistor T3. The transistor T8 has a first terminal to receive a reset voltage RES_DC; the control terminal of the transistor T8 receives a second gate drive signal GATE2[n]; and the second terminal of the transistor T8 is coupled to the control terminal of the transistor T3. The transistor T9 has a first terminal to be coupled to the second terminal of transistor T8; the control terminal of transistor T9 receives a third gate drive signal GATE3[n]; the second terminal of transistor T9 is coupled to the second terminal of the transistor T3. The transistor T10 has a first terminal coupled to the first terminal of the transistor T3; the second terminal of the transistor T10 receives the reference voltage AMP_DC; and the control terminal of the transistor T10 receives the third gate drive signal GATE3[n]. The capacitor C2 has a first terminal to receive the power supply voltage VDD; and the second terminal of the capacitor C2 is coupled to the control terminal of the transistor T3.

Regarding the operational details of the pixel circuit 1300, before the writing operation, the transistor T8 may be turned on according to the second gate drive signal GATE2[n] that is pulled down, and the reset operation is performed by transmitting the reset voltage RES_DC to the control terminal of the transistor T3.

After the reset operation, the transistors T6 and T7 may be turned on according to the first gate drive signal GATE1[n] during the writing operation. Then, the second gate drive signal GATE2[n] and the third gate drive signal GATE3[n] may be pulled low in sequence. Correspondingly, the transistor T8 is turned on according to the second gate drive signal GATE2[n], and the transistors T9 and T10 are turned on according to the third gate drive signal GATE3[n].

Then, the Nth light-emission signal EM[n] is pulled low, and the transistors T2, T4, and T6 are all turned on. At the same time, the Nth ramp control signal TCS[n] generates a falling ramp signal, and the transistor T3 generates a driving current to drive the light-emitting diode LED to emit light.

In this embodiment, in a complete frame rate, the first gate drive signal GATE1[n] can only be enabled once, while the third gate drive signal GATE3[n], the Nth light-emission signal EM[n], and the Nth ramp control signal TCS[n] can be enabled multiple times to perform multiple light-emitting operations. In addition, the brightness of the light-emitting diode LED can be adjusted by pulse-width modulation to control the duty cycles of the Nth light-emission signal EM[n] and the Nth ramp control signal TCS[n]. This allows the light-emitting diode LED to perform the modulation of high and/or low brightness while maintaining high luminous efficiency.

Figure 14A:
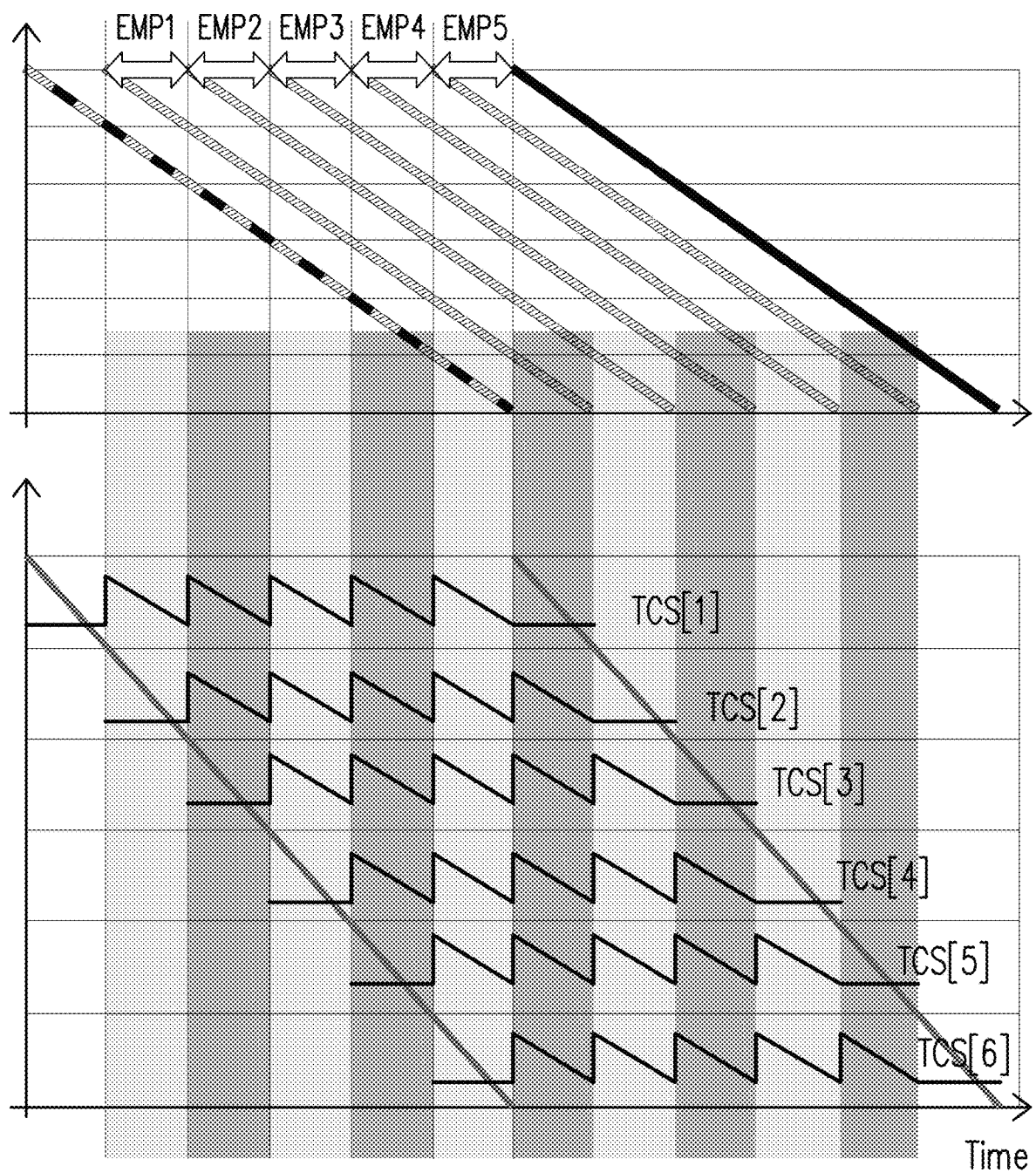
FIG. 14A and FIG. 14B are schematic waveforms of implementations of light-emitting operations of a light-emitting diode display device according to embodiments of the disclosure.
Figure 14B:
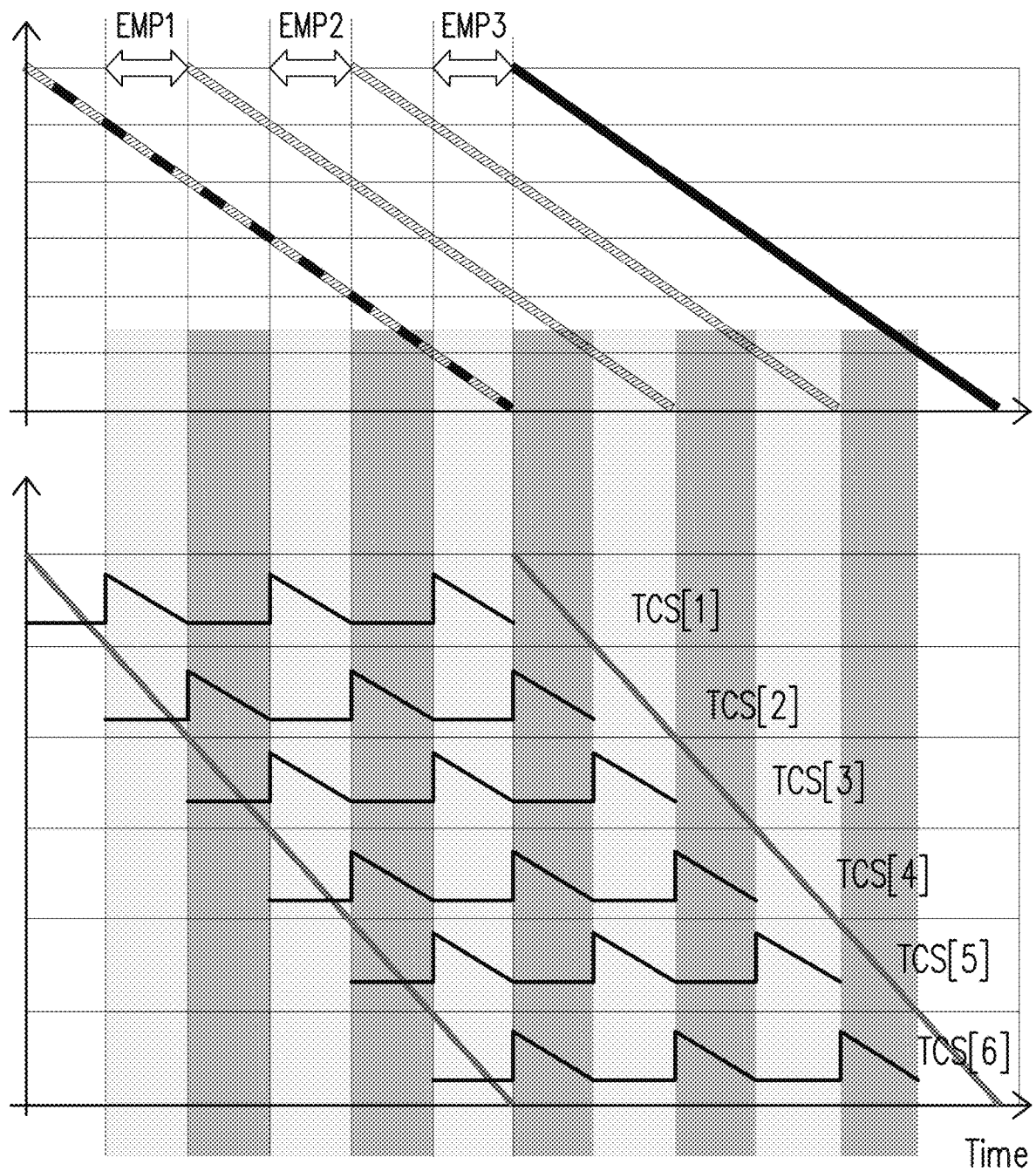

Please refer to FIG. 14A and FIG. 14B. FIG. 14A and FIG. 14B are schematic waveforms of implementations of light-emitting operations of a light-emitting diode display device according to embodiments of the disclosure. In FIG. 14A, a light-emission signal is enabled during multiple consecutive light-emitting time periods EMP1 to EMP5, and multiple light-emitting operations are performed 5 times. Ramp control signals TCS[1] to TCS[6] provide consecutive ramp signals during the light-emitting time periods EMP1 to EMP5. The ramp control signals TCS[1] to TCS[6] are used to drive pixel circuits of multiple stages respectively, where the start time of the control signals TCS[1] to TCS[6] has a preset time shift.

In FIG. 14B, the light-emission signal is enabled during multiple consecutive light-emitting time periods EMP1 to EMP3, and multiple light-emitting operations are performed. The ramp control signals TCS[1] to TCS[6] provide consecutive ramp signals during the light-emitting time periods EMP1 to EMP3. The ramp control signals TCS[1] to TCS[6] are used to drive pixel circuits of multiple stages respectively, where the start time of the control signals TCS[1] to TCS[6] has a preset time shift. In this embodiment, the reference voltage AMP_DC received by the transistor T10 in FIG. 13 may be equal to the write-in data DATA[m]. This way, the current value of the driving current that is output by the pixel circuit each time are corrected, maintaining the uniformity of brightness.

In summary, during the corresponding frame period, which is after the data-writing time period and before the end of the data-writing time period of the next frame period, the display device of the present disclosure makes the light-emission signals generate pulses based on the set period, such that the pixels of the light-emitting diode continues to emit light. This way, when the frame period varies dynamically, the display pixels do not stop emitting light by waiting for a new synchronization signal. Torn images and/or flickers are reduced effectively, improving the display quality.

Moreover, another display device of the embodiments of the present disclosure also effectively reduces the screen flickers and improves the display quality through the coaction of the first gate control signal having a low operating rate, the light-emission signal having a high operating rate, and the ramp control signal, to drive the light-emitting diode with multiple pulse-width modulation.

What is claimed is:

1. A light-emitting diode display device, comprising:
a timing controller;
a plurality of display pixels, adapted to form a plurality of display rows; and
a scanning circuit, adapted to generate a plurality of scan signals and a plurality of light-emission signals for respectively driving the display rows,
wherein, during a first data-writing time period in a first frame period, the timing controller provides a plurality of write-in data to be respectively written into the display rows,
wherein, during a light-emitting time period after the first data-writing time period and before a second data-writing time period in a second frame period ends, the scanning circuit makes each of the light-emission signals generate periodically a plurality of pulses based on a set period to drive each corresponding one of the display rows,
wherein, when a time length of the light-emitting time period is not an integer multiple of the set period, the timing controller sets a delay time period before the second data-writing time period in the second frame period, so that the time length of the light-emitting time period is increased.

2. The light-emitting diode display device according to claim 1, wherein, during the light-emitting time period, the light-emission signals comprise the same number of pulses.

3. The light-emitting diode display device according to claim 1, wherein the increased time length of the light-emitting time period is equal to an integer multiple of the set period.

4. The light-emitting diode display device according to claim 1, wherein: the scanning circuit categorizes the light-emission signals into at least one first light-emission signal and at least one second light-emission signal; the last pulse of the at least one first light-emission signal does not overlap with the second data-writing time period; and the last pulse of the at least one second light-emission signal at least partially overlaps with the second data-writing time period.

5. The light-emitting diode display device according to claim 1, wherein the scanning circuit sequentially makes the scan signals generate a plurality of enabling pulses after the first data-writing time period in the first frame period.

6. The light-emitting diode display device according to claim 5, wherein a plurality of first pulses of the light-emission signals are respectively generated after the enabling pulses.

7. The light-emitting diode display device according to claim 1, wherein a time length of the first frame period is the same as or different from a time length of the second frame period.

8. A light-emission control method, adapted for a light-emitting diode display device, the light-emission control method comprising:

generating a plurality of scan signals and a plurality of light-emission signals to respectively drive a plurality of display rows formed by a plurality of display pixels;
during a first data-writing time period in a first frame period, providing a plurality of first write-in data to be respectively written into the display rows; and
during a light-emitting time period after the first data-writing time period and before a second data-writing time period in a second frame period ends, making each of the light-emission signals generate periodically a plurality of pulses based on a set period to drive each corresponding one of the display rows,
wherein, when a time length of the light-emitting time period is not an integer multiple of the set period, a delay time period is provided before the second data-writing time period in the second frame period, and the time length of the light-emitting time period is increased.

9. The light-emission control method according to claim 8, wherein, during the light-emitting time period, the light-emission signals comprise the same number of pulses.

10. The light-emission control method according to claim 8, wherein the increased time length of the light-emitting time period is an integer multiple of the set period.

11. The light-emission control method according to claim 8, further comprising:
categorizing the light-emission signals into at least one first light-emission signal and at least one second light-emission signal;
preventing the last pulse of the at least one first light-emission signal from overlapping with the delay time period; and
overlapping the last pulse of the at least one second light-emission signal at least partially with the delay time period.

12. The light-emission control method according to claim 8, wherein a time length of the first frame period is the same as or different from a time length of the second frame period.

13. A light-emitting diode display device, comprising:
a plurality of display pixels, wherein: an Nth display pixel performs a data-writing operation according to a corresponding first gate drive signal and lights up a corresponding light-emitting diode according to an Nth ramp control signal and an Nth light-emission signal; the first gate drive signal comprises a first operating rate; and the Nth ramp control signal and the Nth light-emission signal comprise a second operating rate, wherein the first operating rate is lower than the second operating rate, and the N is a positive integer; and
a driving circuit, coupled to the display pixels, and adapted to provide the first gate drive signal, the Nth ramp control signal, and the Nth light-emission signal.

14. The light-emitting diode display device according to claim 13, wherein the Nth display pixel further performs a reset operation according to a corresponding second gate drive signal, wherein the second gate drive signal comprises components of the first operating rate and components of the second operating rate.

15. The light-emitting diode display device according to claim 14, wherein the Nth display pixel further performs a compensation operation according to a corresponding third gate drive signal, and an operating rate of the third gate drive signal is equal to the second operating rate.

16. The light-emitting diode display device according to claim 15, wherein the Nth pixel circuit comprises:
a first capacitor, comprising a first terminal adapted to receive the Nth ramp control signal;

a first transistor, comprising a control terminal coupled to a second terminal of the first capacitor;

a second transistor, comprising a first terminal adapted to receive a first reference voltage, a second terminal coupled to a first terminal of the first transistor, and a control terminal adapted to receive the Nth light-emission signal;

a third transistor, comprising a control terminal coupled to a second terminal of the first transistor;

a fourth transistor, comprising a first terminal adapted to receive a power supply voltage, a second terminal coupled to a first terminal of the third transistor, and a control terminal adapted to receive the Nth light-emission signal; and a fifth transistor, comprising a first terminal coupled to a second terminal of the third transistor, a second terminal coupled to the light-emitting diode, and a control terminal adapted to receive the Nth light-emission signal.

17. The light-emitting diode display device according to claim 16, wherein the Nth pixel circuit further comprises:

a sixth transistor, comprising a first terminal adapted to receive write-in data, a second terminal coupled to the first terminal of the first transistor, and a control terminal adapted to receive the first gate drive signal;

a seventh transistor, comprising a first terminal coupled to the second terminal of the first capacitor, a control terminal adapted to receive the first gate drive signal, and a second terminal coupled to the control terminal of the third transistor;

an eighth transistor, comprising a first terminal adapted to receive a reset voltage, a control terminal adapted to receive the second gate drive signal, and a second terminal coupled to the control terminal of the third transistor;

a ninth transistor, comprising a first terminal coupled to the second terminal of the eighth transistor, a control terminal adapted to receive the third gate drive signal, and a second terminal coupled to the second terminal of the third transistor;

a tenth transistor, comprising a first terminal coupled to the first terminal of the third transistor, a second terminal adapted to receive a second reference voltage, and a control terminal adapted to receive the third gate drive signal; and a second capacitor, comprising a first terminal adapted to receive the power supply voltage, and a second terminal coupled to the control terminal of the third transistor.

18. The light-emitting diode display device according to claim 13, wherein the Nth light-emission signal is enabled, and the Nth ramp control signal falls from a first voltage to a second voltage during a first time period according to a set slope.

19. The light-emitting diode display device according to claim 18, wherein the Nth light-emission signal is maintained to be enabled during a second time period, and the first time period is equal to or shorter than the second time period.

20. The light-emitting diode display device according to claim 13, wherein the second operating rate is an integer multiple of the first operating rate.

* * * * *